United States Patent [19]

Owen et al.

[11] Patent Number: 5,254,438
[45] Date of Patent: Oct. 19, 1993

[54] SINGLE PASS COMPENSATION FOR ELECTRON BEAM PROXIMITY EFFECT

[75] Inventors: Geraint Owen; Hua-Yu Liu, both of Palo Alto, Calif.

[73] Assignee: Hewlett-Packard Company, Palo Alto, Calif.

[21] Appl. No.: 863,917

[22] Filed: Apr. 6, 1992

Related U.S. Application Data

[63] Continuation of Ser. No. 621,192, Nov. 29, 1990, abandoned.

[51] Int. Cl.$^5$ .............................................. G03C 5/00
[52] U.S. Cl. ...................................... 430/296; 430/30
[58] Field of Search ................................. 430/30, 296

[56] References Cited

U.S. PATENT DOCUMENTS

| | | | |
|---|---|---|---|
| 4,213,053 | 7/1980 | Pfeiffer | 250/492 A |
| 4,264,711 | 4/1981 | Greeneich | 430/296 |
| 4,463,265 | 7/1984 | Owen et al. | 430/296 |
| 4,746,587 | 5/1988 | Nicholas | 430/5 |
| 4,816,361 | 3/1989 | Glendinning | 430/5 |
| 5,008,553 | 4/1991 | Abe | 430/296 |
| 5,130,213 | 7/1992 | Berger et al. | 430/296 |

OTHER PUBLICATIONS

"Proximity effect correction for electron beam lithography by equalization of background dose", Owen and Rissman, pp. 3573-3581, Journal Appl. Phys. vol. 54, No. 6, 1983.

Primary Examiner—John Kight, III
Assistant Examiner—T. Mosley

[57] ABSTRACT

A method for compensation for the proximity effect in electron beam lithography on an e-beam resist material. The exposed surface of the resist material is subdivided into non-overlapping pixels of approximately equal area, with a first set of pixels representing a selected pattern for e-beam lithography and a second set of pixels including all other pixels. The cumulative exposure for each pixel in the first set is computed by adding to the direct beam exposure of that pixel the contributions of spillover (backscattering) exposure arising from exposure of nearby pixels in the second set. The cumulative exposure for each pixel in the second set is computed by adding to the reduced beam exposure of that pixel the contributions of spillover exposure arising from exposure of nearby pixels in the second set. The resist material is then irradiated, pixel-by-pixel with a fixed electron beam radius, with the exposure at each pixel being equal to the cumulative exposure computed for that pixel.

12 Claims, 3 Drawing Sheets

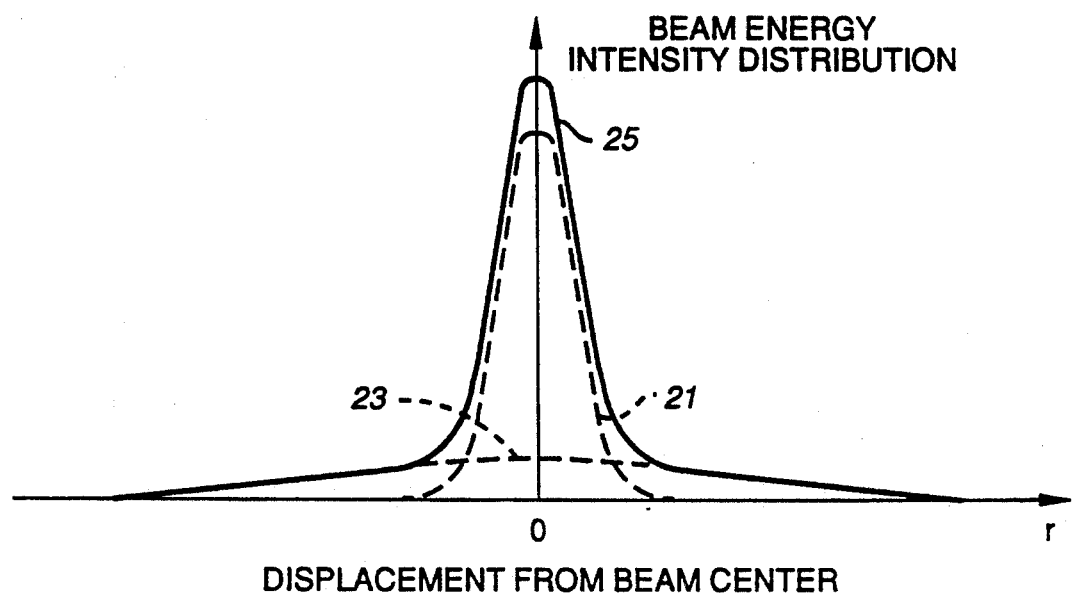
FIG._1
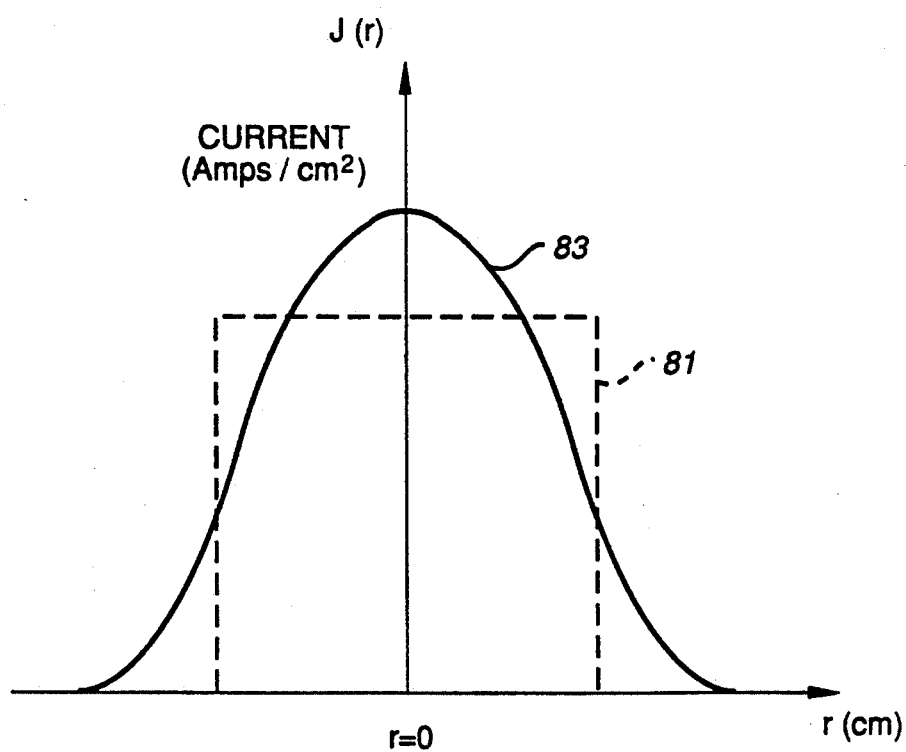
FIG._6

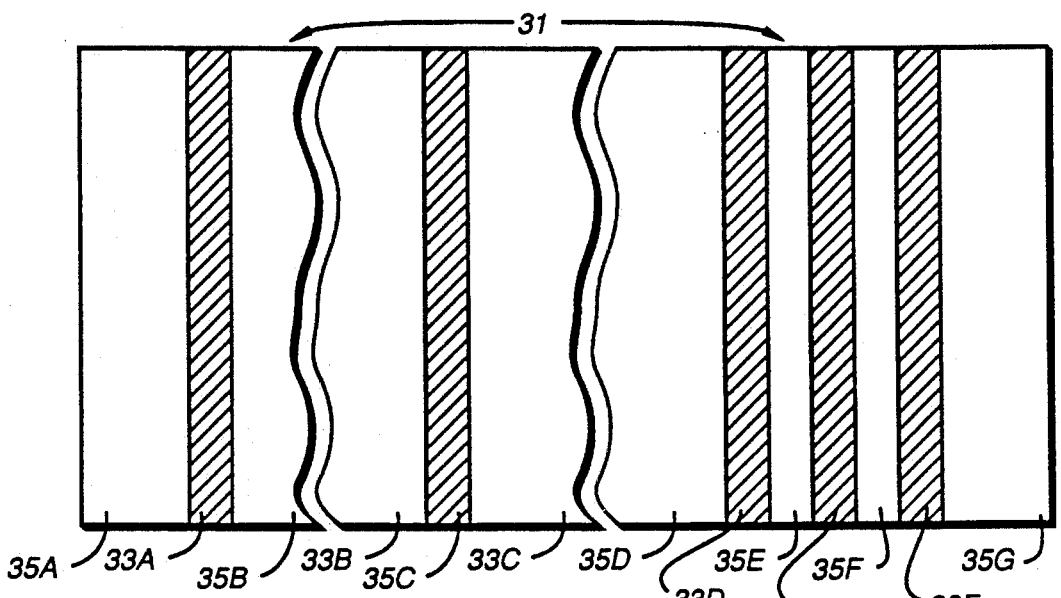
FIG._2A
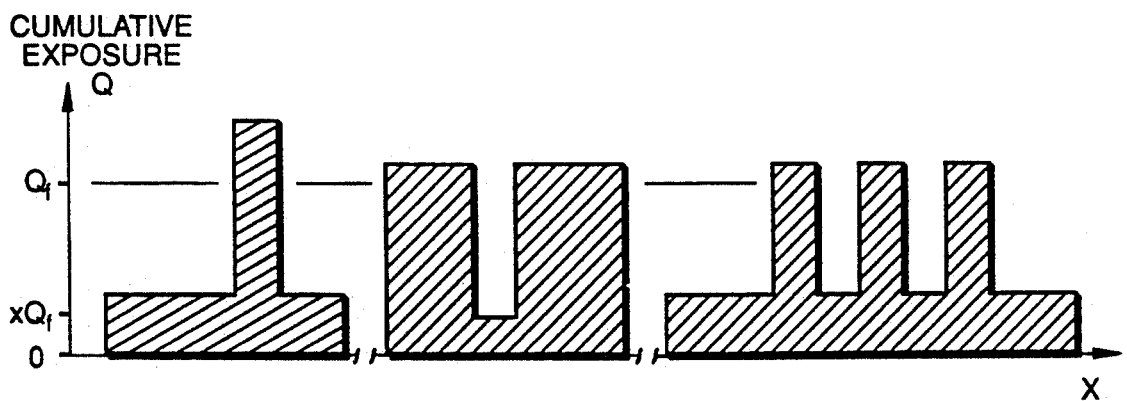
FIG._2B
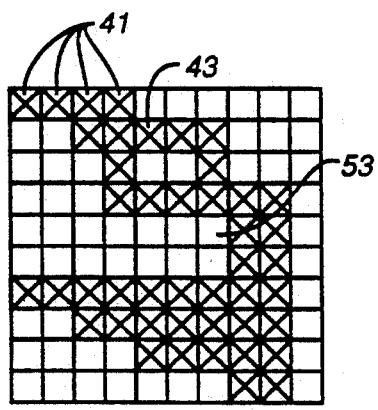
FIG._3
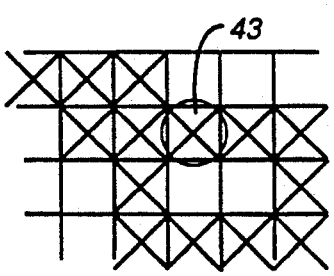
FIG._4A
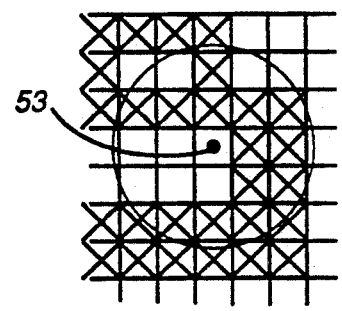
FIG._4B

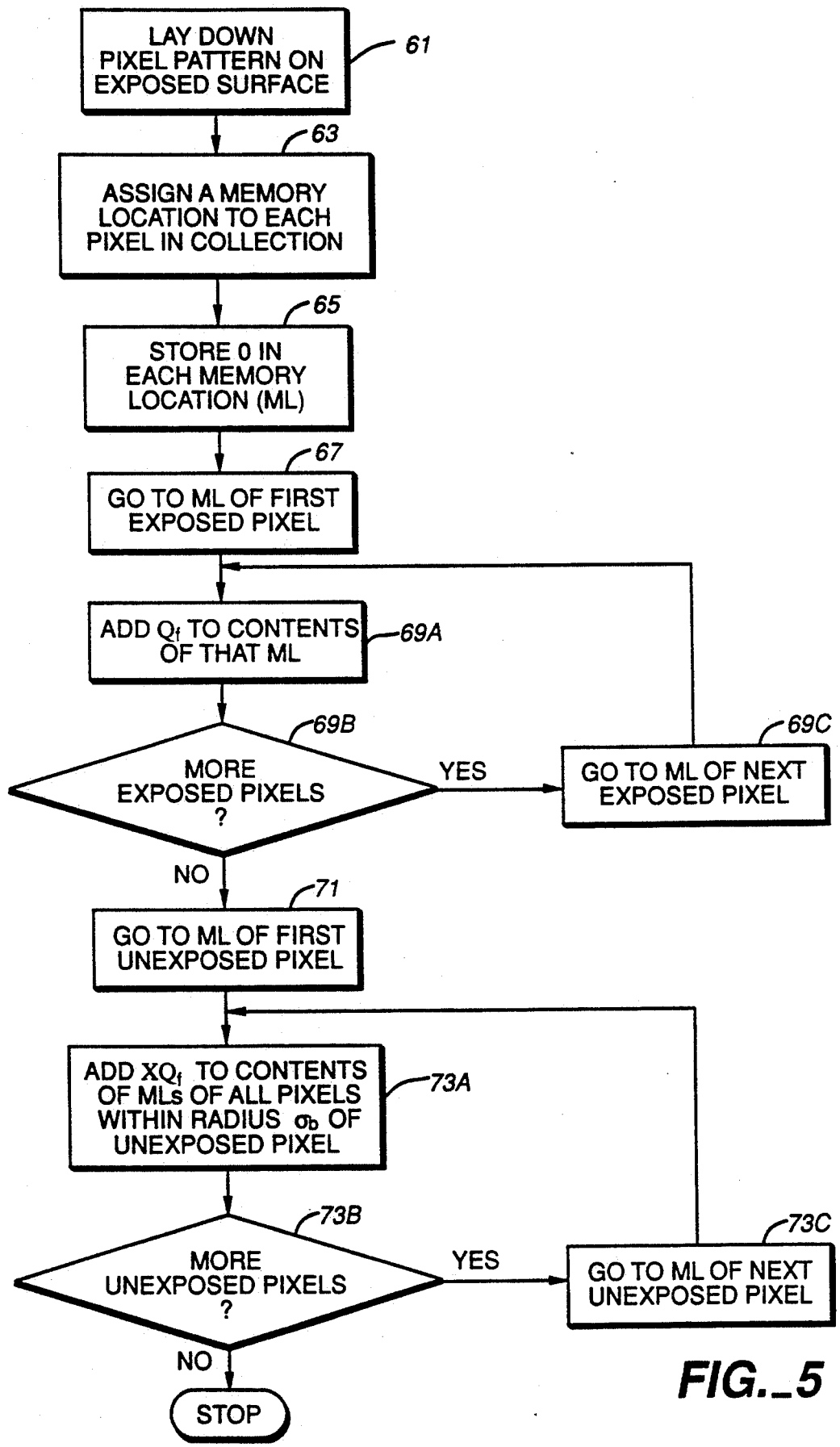
FIG._5

SINGLE PASS COMPENSATION FOR ELECTRON BEAM PROXIMITY EFFECT

This application is a continuation of application Ser. No. 7/621,192, filed 29 Nov. 1990, now abandoned.

TECHNICAL FIELD

This invention relates generally to electron beam imaging and more particularly to correction of electron beam exposures in a layer of material for the proximity effect produced by backscattering of electrons.

BACKGROUND OF THE INVENTION

As noted by T. H. P. Chang, Jour. Vac. Sci. Tech., vol. 12 (1975), 1271-1275, and by others, a uniform exposure by an incident electron beam can produce a non-uniform distribution of energy deposition in the pattern area, due to backscattering of the electrons both within the directly exposed material and within any substrate serving as backing for that material. A large pattern element will receive more exposure than a small pattern element, and an isolated pattern element will receive less exposure than a pattern element that is adjacent to other pattern elements that are exposed to the electron beam. Further, a small exposed region positioned at the center of the pattern element will receive more exposure from the adjacent regions that surround that central region, than will a small region positioned adjacent to an edge of a pattern element. If a predetermined group of lines is irradiated, the absorbed energy spread surrounding each of these lines will depend upon line width and line-to-line gap width, among other things. Chang, op. cit., noted that variation of exposure dosage for line widths and gap widths less than one $\mu$m is particularly troublesome here at a beam energy of 20 keV.

Previous workers have sought to compensate for the proximity effect and other effects that reduce the resolution in electron beam lithography by a number of approaches.

Greeneich observes in U.S. Pat. No. 4,264,711 that proximity effects result in substantially reduced electron beam exposure near the edges of a pattern element, as compared to net beam exposure in the interior of the pattern element. Greeneich remedies this nonuniformity within the pattern element by exposing the perimeter of a pattern element to the electron beam for a substantially greater time duration than the exposure time for an interior region within the pattern element.

Owen and Rissman, in U.S. Pat. No. 4,463,265, disclose use of a first beam irradiation that exposes the selected pattern and provision of a second electron beam irradiation that exposes all points in the complementary pattern on the surface of the material. The two beam irradiations are carried out in separate time intervals, and the beam parameters of the second irradiation are chosen to attempt to provide a uniform background of energy deposition due to electron backscattering throughout the material. The discussion in this patent is incorporated by reference herein.

Nakasuji et al., in U.S. Pat. No. 4,743,766, also proposes to provide two electron beam irradiations, in the same manner to correct for proximity effects. However, rather than using two separate exposures, Nakasuji et al. discloses use of a special e-beam tool that attenuates and de-focuses the beam rather than blanking the beam away from the irradiated pattern.

U.S. Pat. No. 4,746,587, issued to Nicholas, discloses use of the Owen and Rissman approach, using a cathode projection system and selective photoemission of electrons.

In applications of electron beam lithography to fabrication of integrated circuits, the lithography is often applied to patterning of an electron beam resist layer, attached to a substrate, through which the electron beam is to pass.

Incident electrons that pass through the resist material are scattered, and even backscattered, by atoms in the substrate material so that a significant fraction of these incident electrons return to the resist material, producing an undesired exposure of the resist layer that reduces the desired contrast of the pattern in the resist layer. The contrast of a patterned region then becomes dependent on the pattern density in that region so that proximity effect creates dimensional errors whose magnitudes depend on pattern density. Note that the proximity effect does not, as is commonly asserted, result in a loss of resolution. An example of the effect of scattering by substrate atoms is illustrated in FIG. 1 of the Owen and Rissman patent, op. cit.

Using Monte Carlo electron transport simulations, Chang, op. cit., has experimentally studied the exposure intensity distribution ("EID", a measure of electron energy deposition) of a 25 keV electron beam incident upon a silicon wafer covered with 0.6 $\mu$m of PMMA resist and developed at room temperature for sixty seconds. Chang found that the EID can be closely approximated by the sum of two Gaussian distributions, namely $E(r) = C_1 \exp[-(r/B_1)^2] + C_2 \exp[-(r/B_2)^2]$, where $B_2/B_1 \gg 1$ and $C_2/C_1 < 1$. The second term in the EID function $E(r)$ represents additional exposure of the resist by the backscattered electrons, and the phenomenon associated with this is known as the proximity effect. For an incident electron beam having a beam width after focusing of the order of 0.5 $\mu$m or less, the radius of the region exposed by the backscattered electrons can be of the order of 2 $\mu$m at 20 keV initial beam energy. The ratio of the total energies deposited in the resist by the backscattered and toward traveling electrons is conventionally denoted by $\eta_e$. With reference to Chang's formulation, $$\eta_e = \frac{C_2 R_b^2}{C_1 R_b^2}$$

$\eta_e$ is commonly known as the "backscattered energy coefficient."

Jackel et al., in Appl. Phys. Lett., vol. 45 (1984), pp. 698-700 report experimental measurements of he, ranging from 0.70-0.78, for initial beam energies E of 20-120 keV and conclude that he is approximately independent of beam energy. Jackel et al. also find that the electron range $\beta$ in a resist material increases approximately as $\beta \alpha E^{1.7}$, which agrees with conclusions of Parikh and Kyser, Jour. Appl. Phys., vol. 50 (1979), pp. 1104-1111, who studied electron beam scattering in a resist material using Monte Carlo simulations.

The effect of the backscattered electrons on contrast is discussed and illustrated in the Owen and Rissman patent, op. cit., in connection with FIGS. 3A, 3B, 3C, 4A, 4B and 4C therein and is incorporated herein by reference. It is found that the heights of a sequence of peaks corresponding to desired pattern lines from electron beam lithography do not have the same maximum heights (peaks) or the same minimum heights (valleys) so that the amounts of exposure at the "centers" of the pattern lines are not uniform. The amount of exposure in the spaces between adjacent lines also is not uniform.

Several methods have been proposed to compensate for the proximity effect, including (1) compensation by dose correction, (2) compensation by pattern shape correction and (3) compensation by use of multi-level resist films. Each of these techniques incompletely compensates for the backscattered energy distribution so that some error in pattern dimensions is still present. A method is needed that more precisely compensates for the presence of, and deposition of additional beam energy due to, the back-scattered electrons within the resist material. Preferably, the method should allow irradiation of the exposed areas of the resist material with a single pass, rastered or vector-scanned electron beam.

SUMMARY OF THE INVENTION

These needs are met by a dose correction scheme, in which the charge density of the electron beam is varied as the beam is scanned across the selected pattern, as in other dose schemes. The selected pattern data is preprocessed before exposure in order to calculate the required dose variations. In particular, the preprocessing scheme is parallel to, but differs from, the scheme of Owen and Rissman, simulating the effect of the correction exposure used in that technique in the preprocessing calculations. Previous workers needed to make a second exposure to correct for the proximity effect; this is not needed here. Moreover, in the present case, the incident charge density must be varied as the pattern is written on the resist material.

The preprocessing calculation is carried out as follows. Each pixel in the pattern field is allocated a memory location in the computer. Each location corresponding to each pixel in the selected pattern is allocated a number Q, corresponding to the incident change density deposited by the e-beam. Next, the computer looks to each pixel in the complementary pattern (all pixels not in the selected pattern), and "draws" a circle radius $R_b(1+\eta_e)^{-\frac{1}{2}}$ around the center of that pixel. A correction beam exposure $Q_{thr}=Q\eta_e d^2/\pi R_b^2(1+\eta_e)^{\frac{1}{2}}$ is added to each pixel lying within this circle, where $R_b$ is the radius of the backscattered beam, d is the diameter of a pixel used for analysis of beam intensity and $\eta_e$ is a beam correction parameter $(0<\eta_e)$. Where a pixel is intersected by the circle, if more than 50% of the pixel area lies within the circle, that pixel is treated as being completely included with the circle. Preprocessing is complete when all pixels in the selected pattern and in the complementary pattern have been treated as described here.

The exposure is carried out by modulating the incident charge density at each pixel by the number stored in the corresponding memory location. What is novel about the scheme is the preprocessing calculation. In particular, the computational time increases directly as the total number N of pixels used. By contrast, conventional dose correction schemes are computationally more intensive, with the computation time typically increasing as $N^3$.

This scheme is computationally simple, and the number of arithmetic operations required increases only linearly with the number of pixels, and the effectiveness of the correction should be almost as good as that of the approach presented in the Owen and Rissman patent, op. cit. Slight degradation may be introduced by the quantization inherent in the procedure, but this should be very small. This scheme allows a more representative dose distribution to be simulated than the "top hat" function generated by physically defocusing the electron beam as contemplated in the Owen and Rissman patent.

BRIEF DESCRIPTION OF THE DRAWINGS

FIG. 1 illustrates the beam energy intensity distribution, as a function of the radial displacement (r) from the center of an incident narrow electron beam, for a forward scattered beam and a backscattered beam arising from this forward scattered beam.

FIG. 2A illustrates a selected pattern and its complementary pattern on an exposed surface of resist material.

FIG. 2B illustrates a suitable charge density distribution for irradiation of pixels in the selected and complementary pattern configuration of FIG. 4A.

FIG. 3 is a plan view of a typical selected pattern (cross-hatched pixels only) on an exposed surface.

FIGS. 4A and 4B illustrate the radii of a direct beam and of a circle corresponding to the backscattered energy distribution (referred to here as the "correction exposure"), respectively, used to irradiate pixels in the selected and complementary patterns, respectively.

FIG. 5 is a flow chart illustrating one embodiment of the proximity effect compensation process, performed according to the invention.

FIG. 6 illustrates two different current distributions, top hat and Gaussian, as functions of the radial distance r.

BEST MODE FOR CARRYING OUT THE INVENTION

With reference to FIG. 1, the curve 21 represents the distribution of energy deposition per unit volume, as a function of radial displacement r from the center of the beam, from electrons in a beam that is incident on the exposed surface of the resist material. The electron beam is assumed to be approximately monoenergetic. The beam electrons decelerate as they first pass through the resist material and deposit a portion of their energy in the resist material along the trajectories of the individual electrons. The energy deposited in this manner is called forward scattered energy deposition. After the beam electrons pass through the resist material, these electrons pass into a substrate or backing material and are scattered further. A portion of the beam electrons is scattered back into the resist material and produces further energy deposition, known as "backward scattering energy deposition" which is closely approximated by the curve 23 in FIG. 1. The curves 21 and 23 shown in FIG. 1 are approximately Gaussian in shape, with the following parameters:

$$E_f(r)=exp(-r^2/R_f^2) \, Q\Delta V_f/\pi R_f^2 h \tag{1}$$

$$E_b(r)=exp(-r^2/R_b^2) \, \eta Q\Delta V_f/\pi R_b^2 h. \tag{2}$$

Here, $R_f$ and $R_b$ designate the $e^{-1}$ beam widths of the forward scattered beam and the backscattered beam, respectively; Q is the charge density incident on the substrate (in Coul/cm$_2$), h is the resist film thickness and $Q\Delta V_f$ is the mean energy lost by a forward-traveling electron as it passes through the film.

For a 20 keV beam incident on the silicon wafer covered with PMMA resist of thickness 5000 Å, the parameters $R_f$, $R_b$, $Q_f$ and $Q_b$ are given approximately by $$R_f \approx 0.1-0.2 \ \mu m, \quad (3)$$

$$R_b \approx 2 \ \mu m, \quad (4)$$

$$\eta_e \approx 0.7, \quad (5)$$

where $\eta_e$ is a backscattering parameter. The result of this electron backscattering is that the radial distribution of backscattered electron beam energy deposited in the resist material (assumed to be "thin") produces an undesirable additional exposure of the resist film in a region adjacent to the tightly defined selected pattern region that was irradiated by the forward scattered beam alone. The curve 25 in FIG. 2 represents the sum of the two energy depositions $E_p(r) = E_f(r) + E_b(r)$, which is the total energy deposition received, as a function of radial distance from the beam center, as a result of the pattern irradiation. The extra exposure of the resist material by the backscattered electrons produces a phenomenon known as the proximity effect and can significantly affect dimensions of circuit features where the feature widths are of the order of 1 $\mu m$ or less. For example, where an incident beam has a width of the order of 0.5 $\mu m$, the region exposed by the backscattered electrons is of the order of 2 $\mu m$ for a 20 keV electron beam incident on a 0.5 $\mu m$ thick resist layer backed by a silicon wafer substrate. If a sequence of approximately parallel, spaced apart lines is to be defined by electron beam irradiation, the distribution of energy deposition in the absence of, and in the presence of, electron backscattering for these lines is illustrated qualitatively in FIGS. 3A and 3B, respectively, of the Owen and Rissman patent. Note that both the background energy deposition and the peak energy deposition, represented by the envelope curves 32A-32G and 33, respectively, in FIG. 3B in Owen and Rissman, op. cit., have non-uniform heights in the presence of electron backscattering.

FIG. 2A is a top view of an example of a pattern on the exposed surface 31, including the selected pattern elements 33A, 33B, 33C, 33D, 33E and 33F that might be irradiated by the direct pattern beam. A second electron beam, called the correction exposure beam, irradiates the complementary pattern, including the elements 35A, 35B, 35C, 35D, 35E, 35F and 35G. The complementary pattern 35 consists of all points on the exposed surface of the resist material that are not a part of the selected pattern 31.

In the patent of Owen and Rissman it is shown that the following relationships must be fulfilled for the proximity effect to be corrected by this method. Let the charge density used for the pattern exposure be Q (Coul/cm²), and let the energy backscatter coefficient be $\eta_e$, and the 1/e radius of the backscattered energy distribution be $R_b$. Then, for the correction exposure, the required charge density is $$Q_c = Q\eta_e/(1+\eta_e). \quad (6)$$

and the required radius of the defocused beam is $$R' = R_b(1+\eta_e)^{-\frac{1}{2}} \quad (7)$$

This invention first simulates the correction exposure in a computer and then implements the correction. A corresponding charge density is deposited by modulating the beam current of the exposure tool appropriately.

Consider the selected pattern 41 indicated by the cross-hatched pixels among the collection of pixels shown in FIG. 3. Each blank pixel such as 53 belongs to the complementary pattern, and each cross-hatched pixel such as 43 belongs to the simulated (selected) pattern. Each of the pixels in the selected pattern is irradiated by an electron beam with radius $R_f$, where $2R_f$ is approximately equal to the length d of a pixel side ($2R_f \approx d$), and centered at the center of the corresponding pixel.

FIG. 4A illustrates the projection of the circular-direct exposure electron beam (a circle) on the pixel 43 in the simulated selected pattern shown in FIG. 3. Each of the pixels in the pattern defined by the circle centered in the pixel 53 in FIG. 4B. is irradiated by an electron beam with radius $R_f$ and centered at that pixel, with charge density $\eta_e Q d^2 / \pi R'^2 (1+\eta_e)^{\frac{1}{2}} = \chi Q$. This latter charge density is added to this central pixel and to all pixels lying within a circle of radius $R' = R_b(1+\eta_e)^{-\frac{1}{2}}$ centered at this central pixel. This occurs for each pixel in the complementary pattern. Note that each pixel, whether it belongs to the simulated selected pattern or to the simulated complementary pattern, is actually irradiated by a beam of radius $R_f$ that approximately covers one pixel. However, for purposes of the simulation, the correction exposure beam is treated as having a simulation radius $R' = R_b(1+\eta_e)^{-\frac{1}{2}}$ centered at this central pixel. This occurs for each pixel in the circle pattern shown in FIG. 4B. FIG. 4B illustrates a simulated complementary beam radius, centered at the center of pixel 53, with radius $R' \approx 2.5 \ d\chi R_f$.

The cumulative charge density or exposure associated with each pixel in the simulated selected pattern near a boundary, and the cumulative exposure associated with each pixel in the simulated complementary pattern, will vary according to relative shapes of the selected pattern and complementary pattern near each of these irradiated pixels. FIG. 2B illustrates the cumulative exposure associated with various pixels for the following examples of configurations: (1) an isolated, narrow selected pattern line 33A adjacent to two broader components 35A and 35B of the complementary pattern; (2) an isolated, narrow line 35C in the complementary pattern adjacent to two broader components 33B and 33C of the selected pattern; and (3) a sequence of narrow lines 33D, 33E and 33F of the selected pattern, spaced apart by a sequence of narrow lines or other components 35D, 35E, 35F and 35G of the complementary pattern. The "extra" exposure, or excess charge density $Q - Q_f$ for a simulated selected pattern pixel and the excess charge density $Q - \chi Q_f$ for a simulated complementary pattern pixel, demonstrates the effect of "spillover" arising from the use of a simulated correction exposure beam radius $R' = R_b(1+\eta_e)^{-\frac{1}{2}} >> R_f$ for each pixel in the complementary pattern. An isolated complementary pattern pixel such as 35C in FIG. 2B will have only the minimum charge density or exposure $\chi Q$ associated with such pixel. The three examples illustrated in FIG. 2B are not intended to cover all the possibilities extant near boundaries of the selected or complementary patterns.

The algorithm used here to allocate radiation to each pixel for the correction exposure beam (centered at a simulated complementary pattern pixel, such as 53 as shown in FIG. 4B) allocates one unit of radiation of intensity $\chi Q_f$ to a pixel if at least half of that pixel's area is covered by the circle of radius R'. If less than half of that pixel's area is covered by that circle, that pixel is allocated zero radiation intensity for that particular correction exposure.

One embodiment of the method to be used to compensate for the electron beam proximity effect is illustrated in FIG. 5. In the first step 61, a collection of simulation pixels is laid down on the exposed surface, with each pixel having approximately the same shape and same area, no two pixels overlapping, except possibly at a pixel boundary point, and every point on the exposed surface belonging to at least one pixel. In the second and third steps 63 and 65, a memory location is assigned to each pixel in the collection, with a zero value being initially stored in each memory location (step 65). In the fourth step 67, a first pixel of the simulated selected pattern is identified. In step 69A, a quantity Q of exposure is added to the memory location of this first pixel; and this step is repeated for each pixel in the simulated selected pattern (steps 69A, 69B and 69C). In step 71, a first pixel ("c-pixel") of the simulated comby an electron beam with radius $R_f$, where $R_f$ is approximately equal to the length d of a pixel side ($R_f \approx d$), and centered at the center of the corresponding pixel.

FIG. 4A illustrates the projection of the circular-direct exposure electron beam on the pixel 43 in the simulated selected pattern shown in FIG. 3. Each of the pixels in the complementary pattern is irradiated by an electron beam with radius $R_f$ and centered at that pixel, with charge density $\eta_e Q d^2 / \pi R'^2 (1+\eta_e)^{\frac{1}{2}} = \chi Q$. This latter charge density is added to this central pixel and to all pixels lying within a circle of radius $R' = R_b(1+\eta_e)^{-\frac{1}{2}}$ centered at this central pixel. This occurs for each pixel in the complementary pattern. Note that each pixel, whether it belongs to the simulated selected pattern or to the simulated complementary pattern, is actually irradiated by a beam of radius $R_f$ that approximately covers one pixel. However, for purposes of the simulation, the correction exposure beam is treated as having a simulation radius $R' = R_b(1+\eta_e)^{-\frac{1}{2}}$. FIG. 4B illustrates a simulated complementary beam radius, centered at the center of pixel 53, with radius $R' \approx 2.5$ d.

The cumulative charge density or exposure associated with each pixel in the simulated selected pattern near a boundary, and the cumulative exposure associated with each pixel in the simulated complementary pattern, will vary according to relative shapes of the selected pattern and complementary pattern near each of these irradiated pixels. FIG. 2B illustrates the cumulative exposure associated with various pixels for the following examples of configurations: (1) an isolated, narrow selected pattern line 33A adjacent to two broader components 35A and 35B of the complementary pattern; (2) an isolated, narrow line 35C in the complementary pattern adjacent to two broader components 33B and 33C of the selected pattern; and (3) a sequence of narrow lines 33D, 33E and 33F of the selected pattern, spaced apart by a sequence of narrow lines or other components 35D, 35E, 35F and 35G of the complementary pattern. The "extra" exposure, or excess charge density $Q - Q_f$ for a simulated selected pattern pixel and the excess charge density $Q - \chi Q_f$ for a simulated complementary pattern pixel, demonstrates the effect of "spillover" arising from the use of a simulated correction exposure beam radius $R' = R_b(1+\eta_e)^{-\frac{1}{2}} >> R_f$ for each pixel in the complementary pattern. An isolated complementary pattern pixel such as 35C in FIG. 2B will have only the minimum charge density or exposure $\chi Q$ associated with such pixel. The three examples illustrated in FIG. 2B are not intended to cover all the possibilities extant near boundaries of the selected or complementary patterns.

The algorithm used here to allocate radiation to each pixel for the correction exposure beam (centered at a simulated complementary pattern pixel, such as 53 as shown in FIG. 4B) allocates one unit of radiation of intensity $\chi Q_f$ to a pixel if at least half of that pixel's area is covered by the circle of radius R'. If less than half of that pixel's area is covered by that circle, that pixel is allocated zero radiation intensity for that particular correction exposure.

One embodiment of the method to be used to compensate for the electron beam proximity effect is illustrated in FIG. 5. In the first step 61, a collection of simulation pixels is laid down on the exposed surface, with each pixel having approximately the same shape and same area, no two pixels overlapping, except possibly at a pixel boundary point, and every point on the exposed surface belonging to at least one pixel. In the second and third steps 63 and 65, a memory location is assigned to each pixel in the collection, with a zero value being initially stored in each memory location (step 65). In the fourth step 67, a first pixel of the simulated selected pattern is identified. In step 69A, a quantity Q of exposure is added to the memory location of this first pixel; and this step is repeated for each pixel in the simulated selected pattern (steps 69A, 69B and 69C). In step 71, a first pixel ("c-pixel") of the simulated complementary pattern is identified. In step 73A, a quantity $\chi Q$ of exposure is added to the memory location of that pixel and to the memory location of any pixel (belonging to either simulation pattern) lying within a distance $R' = R_b(1+\eta_e)^{\frac{1}{2}}$ of the center of the subject c-pixel; and this irradiation step is repeated for each c-pixel in the simulation complementary pattern (steps 73A, 73B and 73C). This completes the computation of the simulated exposure.

Upon exposure of the actual pattern (in a single pass across all pixels), the dose for a pixel is modulated according to the cumulative exposure values stored in the memory location corresponding to that pixel. The modulation may be achieved by altering the beam current, or by altering the dwell time at each pixel. Scanning of an electron beam across pixels in the actual pattern may use raster scanning or vector scanning.

In the computation of exposure of adjacent pixels arising from a simulated exposure centered at a particular simulated selected pattern pixel or c-pixel, it has been assumed that the radial distribution of the forward scattered electron beam current distribution J resembles that of a top hat distribution, given by $$J_1(r) = J_0 \; r \leq R_1', \quad (8)$$
$$= 0 \; r > R_1',$$

$$R_1 = R_f \text{ or } R', \quad (9)$$

as illustrated by the curve 81 in FIG. 6. A more accurate description of the current J(r) is as a Gaussian distribution $$J_2(r) = J_{20} \exp[-r^2/R_2]. \quad (10)$$
$$J_{20} \cong J_0. \quad (11)$$

-continued $$R_2 = R_1. \quad (12)$$

$$\int_0^\infty J(r) 2\pi r dr = \pi J_{20} R_2^2 = \pi J_0 R'^2. \quad (13)$$

If the top hat current distribution $J_1(r)$ is replaced by the Gaussian current distribution or any other non-uniform current distribution $J_2(r)$, the "center" pixel upon which the beam is presently centered will receive total exposure from that particular beam of $$\int_{-d/2}^{d/2} dx \int_{-d/2}^{d/2} J_2([x^2 + y^2]^{\frac{1}{2}}) dy = \pi R_2^2 J_{20} I_{0,0} \quad (14)$$

for a square pixel shape. With this replacement, a pixel whose center is displaced by the Cartesian coordinates $(\Delta x, \Delta y) = (md, nd)$ relative to the "center" pixel $(m=0, n=0)$ will receive total exposure from that particular beam of $$\int_{(m-\frac{1}{2})d}^{(m+\frac{1}{2})d} dx \int_{(n-\frac{1}{2})d}^{(n+\frac{1}{2})d} J_2([x^2 + y^2]^{\frac{1}{2}}) dy = \pi R_2^2 J_{20} I_{m,n} \quad (15)$$

If the ratio $d/R_2$ is fixed, the integrals $I_{m,n}$ for any integers m and n can be computed numerically; and the total beam exposure contribution to each pixel can be determined and substituted for the top hat cumulative exposure for each pixel. Where a general normalized current distribution $J_f(r;R_f)$, having a characteristic beam radius $R_f$, is used for the forward scattered electron beam, electron backscattering in the substrate and resist material would produce a normalized current distribution $J_b(r;R_b)$ in the resist material in response to this, where $J_b(r;R_b) \approx J_f(R_f r/R_b;R_b)$. If the (non-normalized) energy deposition for the direct beam (simulated selected pattern) is proportional to $Q_f J_f(r;R_f)$, the correction exposure beam energy deposition will be proportional to $Q_b J_b(r;R')$ where $Q_b = \eta_e Q_f/(1+\eta_e)^{\frac{1}{2}}$ and $R' = R_b(1+\eta_e)^{-\frac{1}{2}}$.

A cutoff threshold can be applied to the cumulative exposure computed using a general current distribution, the top hat distribution or Gaussian distribution illustrated by curves 81 and 83 in FIG. 6. If the cutoff threshold $Q_{thr}(\geq \chi Q_f)$ for cumulative exposure of irradiation of a particular pixel by all beams is set relatively high, say $Q_{thr} \lesssim Q_f$, then substantially all radiation due to a correction exposure beam (of radius $R' = R_b(1+\eta_e)^{-\frac{1}{2}}$) centered at all c-pixels would be ignored and only the exposures arising from a beam centered at the simulated selected pattern pixels would be included. In such instance, the plot of cumulative exposure shown in FIG. 2B would appear as a collection of spikes at the simulated selected pattern pixels and would have zero cumulative exposure for all c-pixels. For a cutoff threshold $Q_{thr}$ set between $\chi Q_f$ and $Q_f$, the cumulative exposure for some c-pixels would be ignored. For example, if the cutoff threshold for cumulative exposure is set relatively low, say $Q_{thr} \gtrsim \chi Q$, cumulative exposure for each of a sequence of nearby but spaced apart pixels in the simulated complementary pattern, such as 35D, 35E, 35F and 35G in FIG. 2B, would be retained. However, cumulative exposure for an isolated pixel of the complementary pattern, such as 35C in FIG. 2B, would be set equal to zero.

Although the pixels used for illustration in FIGS. 1, 3, 4A and 4B are squares, other convex shapes such as rectangles and hexagons may be used to provide a tiling or covering of the exposed surface of the resist material.

We claim:

1. An improved method of proximity effect correction to produce a selected radiation pattern in an electron beam resist material, which method, in a single pass across the exposed surface of the resist material, compensates for variation of electron beam energy deposition in the resist material due to electron backscatter, the method comprising the steps of:
    (1) providing a collection of equal area pixels, each having predetermined length d, that covers the exposed surface of the resist material, with the selected pattern being defined by a first set of pixels and a complementary pattern being defined by a second set of pixels that includes no pixels from the first set;
    (2) assigning a corresponding memory location to each pixel, with an initial value of zero being contained in each of these memory locations;
    (3) choosing an electron beam characteristic radius $R_f$ for a direct electron beam and determining a characteristic beam radius $R_b$ for backscattered electrons in the resist material that arises from irradiation by the direct electron beam of characteristic radius $R_f$;
    (4) choosing an electron beam current density $Q_f$ for the direct electron beam;
    (5) for each pixel in the first set, adding the value $Q_f$ to the value contained in the corresponding memory location;
    (6) for each given pixel in the second set, determining the set of all pixels in the first and second sets that lie within a distance $R' = R_b(1+\eta_e)^{-\frac{1}{2}}$ from this given pixel, including the given pixel itself, and adding the value $\chi Q_f$ to the memory locations corresponding to each of these pixels, where $\chi = \eta_e d^2/\pi R_b^2(1+\eta_e)^{\frac{1}{2}}$ and $\eta_e$ is the ratio of energy deposited by backscattered electrons divided by energy deposited by forward scattered electrons;
    (7) determining the accumulated value contained in the memory location corresponding to each pixel in the first set and in the second set after steps (5) and (6) are performed for each pixel in the first and second sets; and
    (8) in a single irradiation, irradiating each pixel on the exposed surface with a scanned electron beam of characteristic beam radius $R_f$, where the radiation exposure for each pixel is equal to the accumulated value contained in the memory location corresponding to that pixel.

2. An improved method of proximity effect correction to produce a selected radiation pattern in an electron beam resist material, which method, in a single pass across an exposed surface of the resist material, compensates for variation of electron beam energy deposition in the resist material due to electron backscatter, the method comprising the steps of:
    (1) providing a collection of equal area pixels, each having a diameter approximately equal to a predetermined length d, that covers the exposed surface of the resist material, with the selected pattern being defined by a first set of pixels and a complementary pattern being defined by a second set of pixels that includes no pixels from the first set;

(2) assigning a corresponding memory location to each pixel, with an initial value of zero being contained in each of these memory locations;

(3) choosing a normalized direct electron beam current density distribution $J_f(r;R_f)$, which may be continuous or discontinuous, as a function of radial distance r from the center of the beam, where the direct electron beam current density distribution has a characteristic beam radius $R_f$, and determining a second normalized electron beam density distribution $J_b(r;R_b) = J_f(R_f r/R_b;R_b)$ that has a characteristic beam radius $R_b$ for backscattering of beam electrons in the resist material that arises from the direct beam of characteristic beam radius $R_f$;

(4) choosing an electron beam current density $Q_f$ for the direct electron beam;

(5) for each given pixel in the first set, determining the integrated current value for an electron beam having a charge density $Q_f J_f(r;R_f)$ centered in this given pixel in the first set and adding this integrated current value to the value in memory for each pixel;

(6) for each pixel in the first and second sets that is located at a distance $r \leq R'$ from a given pixel in the second set, adding a charge density value $Q_b J_b(r;R')$ to the value in memory for each pixel in the first and second sets of pixels, including the given pixel itself, where $Q_b = Q_f \eta_e/(1+\eta_e)^{\frac{1}{2}}$ and $R' = R_b/(1+\eta_e)^{-\frac{1}{2}}$, $\eta_e$ is the ratio of energy deposited by backscattered electrons divided by energy deposited by forward scattered electrons, and $J_b(r;R')$ is a backscattered energy distribution function that decreases as the distance r from the given pixel increases;

(7) determining the accumulated value contained in the memory location corresponding to each pixel in the first set and in the second set after steps (5) and (6) are performed for each pixel in the first and second sets; and (8) in a single irradiation, irradiating each pixel on the exposed surface with a scanned electron beam of characteristic beam radius $R_f$ where the radiation exposure for each pixel is equal to the accumulated value contained in the memory location corresponding to that pixel.

3. A method of proximity effect correction to produce a selected radiation pattern in an electron beam resist material, the method comprising the steps of:

(1) depositing an electron beam resist material on a substrate;

(2) in computer memory, assigning pixel locations to pixel areas of the resist material such that each pixel location in computer memory corresponds to a pixel area of the resist material;

(3) selecting a pattern to be formed in the resist material, including determining which pixel areas are to be exposed in order to form the pattern in the resist material;

(4) in computer memory, designating as first pixel locations those pixel locations corresponding to pixel areas that are to be exposed and further designating as second pixel locations those pixel locations corresponding to pixel areas other than the pixel areas corresponding to the first pixel locations;

(5) selecting a first value of exposure charge for reacting the resist material;

(6) in computer memory, assigning the first value of exposure charge to the first pixel locations;

(7) selecting a second value of exposure charge in response to expected backscattering of electrons when the resist material is exposed to electron beam irradiation, the second value being less than the first value;

(8) in computer memory, determining a defined neighborhood for each of the second pixel locations;

(9) in computer memory, on a pixel-by-pixel basis adding the second value of exposure charge to each first and each second pixel location in the defined neighborhood of each second pixel location; and

(10) using an electron beam, irradiating each pixel area of the resist material in accordance with a cumulative value of exposure charge stored in the corresponding pixel location in computer memory, the cumulation values of each pixel location being the combination of first and second values of exposure charge as determined in steps (5)–(9).

4. The method of claim 3 wherein selecting the second value is a determination of a value that is a multiple of said first value, the multiple being equal to $\eta_e d^2/\pi R_b^2(1+\eta_e)^{\frac{1}{2}}$ where d is the diameter of each pixel area, $R_b$ is the beam radius of said expected back-scattering of electrons and where $\eta_e$ is the ratio of energy to be deposited by backscattered electrons divided by energy to be deposited by forward scattered electrons.

5. The method of claim 4 wherein determining the neighborhood for each of the second pixel locations is a determination of all pixels within the distance $R_b(1+\eta_e)^{-\frac{1}{2}}$ from each of the second pixel locations.

6. The method of claim 1, wherein said exposure for each of said pixels in said first set and said second set is adjusted by adjusting the current density of said electron beam.

7. The method of claim 1, wherein said exposure for each of said pixels in said first set and said second set is adjusted by adjusting the dwell time of said electron beam.

8. The method of claim 1, further comprising the steps of:

choosing a threshold current density $Q_{thr} \geq Q_f \eta_e d^2/\pi R_b^2(1+\eta_e)^{\frac{1}{2}}$; and for each of said memory locations for which said accumulated value contained in said memory location is less than $Q_{thr}$, replacing that accumulated value by the value zero before said pixels are irradiated by said electron beam.

9. The method of claim 2, wherein said exposure for each of said pixels in said first set and said second set is adjusted by adjusting the current density of said electron beam.

10. The method of claim 2, wherein said exposure for each of said pixels in said first set and said second set is adjusted by adjusting the dwell time of said electron beam.

11. The method of claim 2, further comprising the steps of:

choosing a threshold integrated current density value $Q_{thr}$ that is at least equal to the smallest accumulated value contained in one of said memory locations; and for each of said memory locations for which the accumulated value contained in that memory location is less than $Q_{thr}$, replacing that accumulated value by the value zero before said pixels are irradiated by said electron beam.

12. The method of claim 2, further comprising the step of choosing said current distribution $Jf(r;Rf)$ from the class of distributions consisting of a top hat distribution and a Gaussian distribution.

* * * * *